(12) United States Patent
Kurachi

(10) Patent No.: US 9,960,043 B2
(45) Date of Patent: May 1, 2018

(54) PROCESS OF FORMING SEMICONDUCTOR DEVICE

(71) Applicant: SUMITOMO ELECTRIC DEVICE INNOVATIONS, INC., Yokohama (JP)

(72) Inventor: Yasuyo Kurachi, Yokohama (JP)

(73) Assignee: SUMITOMO ELECTRIC DEVICE INNOVATIONS, INC., Yokohama (JP)

(*) Notice: Subject to any disclaimer, the term of this patent is extended or adjusted under 35 U.S.C. 154(b) by 21 days.

(21) Appl. No.: 15/352,811

(22) Filed: Nov. 16, 2016

(65) Prior Publication Data

US 2017/0140939 A1  May 18, 2017

(30) Foreign Application Priority Data

Nov. 16, 2015  (JP) .................................. 2015-224110

(51) Int. Cl.
*H01L 21/265* (2006.01)
*H01L 21/311* (2006.01)
(Continued)

(52) U.S. Cl.
CPC ...... *H01L 21/2654* (2013.01); *H01L 21/0217* (2013.01); *H01L 21/0254* (2013.01);
(Continued)

(58) Field of Classification Search
CPC ............. H01L 21/0217; H01L 21/0254; H01L 21/2654; H01L 21/31116; H01L 21/3245; H01L 29/0653; H01L 29/2003; H01L 29/205; H01L 29/66462; H01L 29/7787; H01L 21/78–21/86;
(Continued)

(56) References Cited

U.S. PATENT DOCUMENTS 5,874,747 A * 2/1999 Redwing ............... H01L 33/007
                                                      257/103
9,673,094 B2 * 6/2017 Watanabe ......... H01L 21/76883
(Continued)

FOREIGN PATENT DOCUMENTS

JP       10-79392 A      3/1998

*Primary Examiner* — Mary Wilczewski
(74) *Attorney, Agent, or Firm* — Venable LLP; Michael A. Sartori; Miguel A. Lopez

(57) ABSTRACT

A process of forming a semiconductor device using plasma processes is disclosed. The semiconductor device includes a device area, a scribed area, and a peripheral area on a wafer, where these areas have respective conductive regions. The process includes steps of (a) implanting ions to isolate the conductive regions in the device area from the conductive region in the scribed area; (b) forming a metal film so as to cover a back surface, a side, and the peripheral area in the top surface of the wafer; (c) deposing insulating film on a whole surface of the wafer; and (d) selectively etching, by the plasma process, the insulating film so as to expose the conductive regions in the device area and the scribed area. During the plasma process, the metal film in the back surface of the wafer is connected the apparatus ground that effectively dissipates charges induced by the plasm to the apparatus ground through the metal film.

11 Claims, 19 Drawing Sheets

(51) Int. Cl.

| | | |
|---|---|---|
| *H01L 21/78* | (2006.01) | |
| *H01L 29/778* | (2006.01) | |
| *H01L 29/06* | (2006.01) | |
| *H01L 29/20* | (2006.01) | |
| *H01L 29/205* | (2006.01) | |
| *H01L 29/66* | (2006.01) | |
| *H01L 21/02* | (2006.01) | |
| *H01L 21/324* | (2006.01) | |
| *H01L 23/544* | (2006.01) | |

(52) U.S. Cl.
CPC .... *H01L 21/31116* (2013.01); *H01L 21/3245* (2013.01); *H01L 21/78* (2013.01); *H01L 23/544* (2013.01); *H01L 29/0653* (2013.01); *H01L 29/2003* (2013.01); *H01L 29/205* (2013.01); *H01L 29/66462* (2013.01); *H01L 29/7787* (2013.01); *H01L 2223/5446* (2013.01)

(58) Field of Classification Search
CPC .......... H01L 21/425–21/426; H01L 21/76825; H01L 21/2253; H01L 21/046–21/047; H01L 21/76862; H01L 21/265–21/266; H01L 21/3065–21/3088; H01L 21/31155
See application file for complete search history.

(56) References Cited

U.S. PATENT DOCUMENTS

| | | | | |
|---|---|---|---|---|
| 9,847,455 | B2* | 12/2017 | Yoo | H01L 33/32 |
| 2014/0127880 | A1* | 5/2014 | Grivna | H01L 21/78 438/458 |
| 2015/0123264 | A1* | 5/2015 | Napetschnig | H01L 21/78 257/737 |
| 2016/0190299 | A1* | 6/2016 | Watanabe | H01L 21/76883 257/76 |
| 2017/0140939 | A1* | 5/2017 | Kurachi | H01L 21/2654 |
| 2017/0256638 | A1* | 9/2017 | MacElwee | H01L 29/7787 |
| 2017/0263462 | A1* | 9/2017 | Okita | H01L 21/3065 |
| 2017/0352593 | A1* | 12/2017 | Grivna | H01L 21/6836 |
| 2018/0012770 | A1* | 1/2018 | MacElwee | H01L 21/30612 |

* cited by examiner

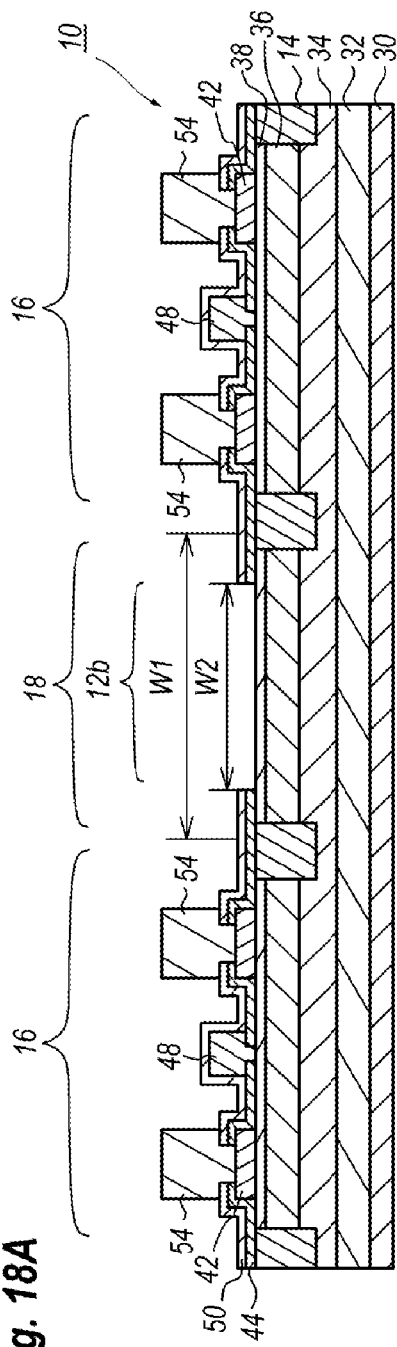
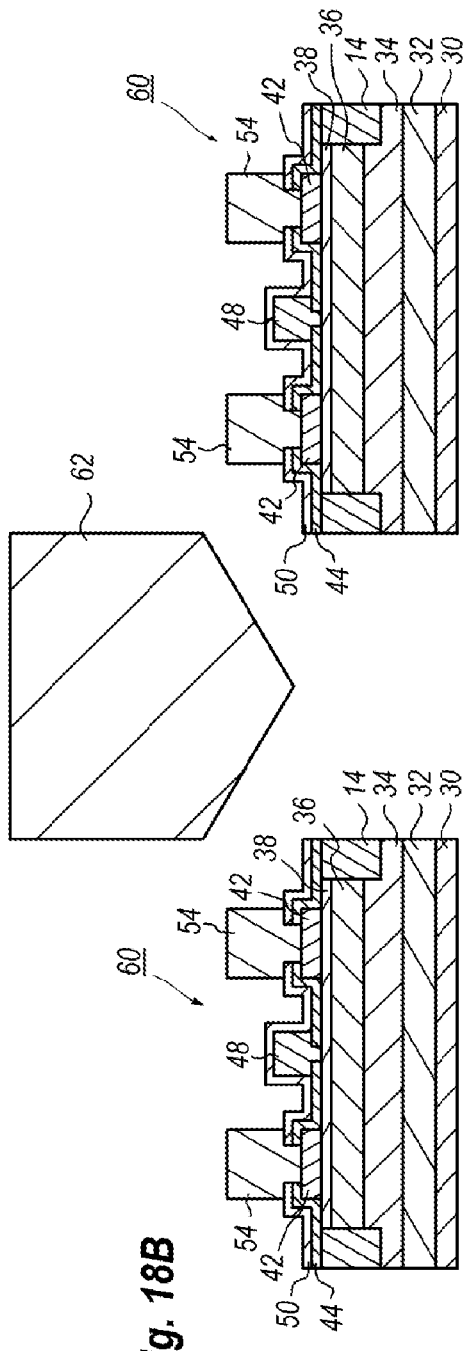

PROCESS OF FORMING SEMICONDUCTOR DEVICE

BACKGROUND

1. Field of the Invention

The present invention relates to a process of forming a semiconductor device, in particular, relates to plasma process such as a plasma-enhanced chemical vapor deposition, a sputtering, a reactive ion etching (RIE) and so on.

A process of forming a semiconductor device often performs plasma processes, such as a reactive ion etching (RIE), a plasma-enhanced chemical vapor deposition (p-CVD), a sputtering, and so on. The plasma etching ionizes gasses such as carbon tetrafluoride ($CF_4$), sulfur hexafluoride ($SF_6$), and so on with a radio frequency (RF) signal to make plasma. Ions and/or radials contained in the plasma may etch an insulating film of silicon nitride (SiN), silicon oxide (SiO), and so on. Such a dry etching inevitably accumulates charges on a surface of an object to be etched, which is often called as the charge-up. A prior patent document laid open No. JP-H10-079392 has disclosed a technique to couple electrons and positive ions captured within a silicon (Si) wafer during the plasm etching.

The charge-up described above raises electric potential of the surface of the object, which forms a potential difference between the surface and an interior of the object and causes a substantial current from the surface to the interior. This current sometimes induces damage in a semiconductor layer or a device, which increases a leak current. Also, the plasma sometimes causes fatal damages in the semiconductor layer by arcing. In particular, when the substrate is made of nitride semiconductor material, such as gallium nitride (GaN), which inherently shows extremely high resistivity; the charges induced during the plasma process easily concentrate on a surface of the wafer, or a center of a surface of the wafer. Accordingly, the process of forming a semiconductor device primarily made of nitride semiconductor materials is necessary to consider the charge-up during the plasma process.

SUMMARY OF THE INVENTION

An aspect of the present invention relates to a process of forming a semiconductor device, in particular, using plasma process. The semiconductor device, which is provided on a wafer, provides device areas each having a conductive region, scribed areas each having a conductive region, and a peripheral area also having a conductive region. The process of the invention includes steps of: (a) implanting ions between the device areas and the scribed areas to form isolation regions, where the isolation regions electrically isolate the conductive regions in the device areas from the conductive regions in the scribed areas such that the isolation regions surround the conductive regions in the device areas and the conductive regions in the scribed areas surround the isolation regions; (b) forming a metal film on a back surface, a side, and the peripheral area of the wafer in a top surface thereof opposite to the back surface, where the conductive region in the peripheral area is continuous to the conductive regions in the scribed areas without interposing the isolation regions therebetween; (c) forming an insulating film on a whole of the top surface of the wafer; and (d) selectively etching the insulating film by a plasma process to expose the conductive regions in the device areas and the conductive regions in the scribed areas.

The process may further include as step of forming gate metals so as to be directly in contact to the conductive regions in the device areas exposed by the plasma process but the conductive regions in the scribed areas and the conductive regions in the peripheral area are not covered with the gate metals. According to the process of the present invention, the conductive regions in the scribed areas are exposed to the plasma during the plasma process, which may suppress charges induced by the plasma from accumulating in a surface of the conductive regions in the device areas and accelerate the charges also induced by the plasma and accumulating on the surface of the conductive regions in the scribed areas to be dissipated to the apparatus ground through the conductive region of the peripheral area and the metal film adhering onto the back surface of the wafer.

BRIEF DESCRIPTION OF THE DRAWINGS

The foregoing and other purposes, aspects and advantages will be better understood from the following detailed description of a preferred embodiment of the invention with reference to the drawings, in which:

FIG. 13A illustrates the process by showing a cross section in the device area, while.

FIG. 18A shows a cross section of the wafer, while, FIG. 18B illustrates the process of dividing the wafer into respective semiconductor chips.

First Embodiment

Figure 1A:
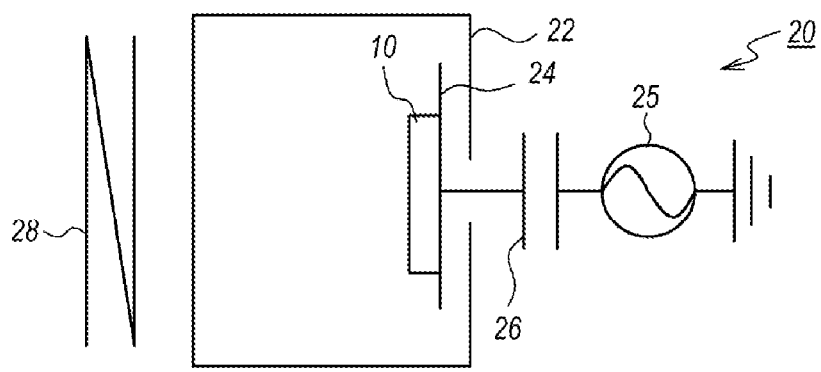
FIG. 1A schematically illustrates an apparatus of a plasma process, FIG. 1B schematically shows a cross section of the wafer of the present invention, and FIG. 1C also schematically shows a cross section of a semiconductor device comparable to the present invention.

Explained first is a mechanism of the present invention as comparing with a conventional technique. FIG. 1A schematically illustrates an apparatus of a plasma process, which is called as the inductively coupled plasma (ICP) etcher. The ICP etcher 20 includes a reactive chamber 22, a wafer stage 24, a signal source 25 of a radio frequency (RF), a coupling capacitor 26, and an induction coil 28. The wafer stage 24, which is set so as to face the induction coil 28, receives the RF signal from the RF signal source 25 through the coupling capacitor 26. A wafer 10 to be processed is set on the wafer stage 24. Plasma generated by the magnetic field induced by the induction coil 26 is irradiated on the wafer 10 by accelerated with the electric field generated by the RF signal. The wafer 10 shown in FIG. 1 is processed after steps of an ion implantation that forms isolation regions and a deposition of an insulating film shown in FIGS. 8A and 8B.

Figure 1B:
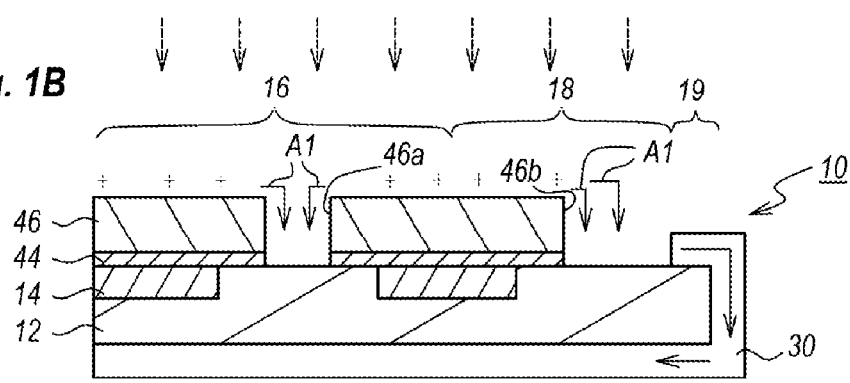

FIG. 1B schematically shows a cross section of the wafer 10 of the present invention. The wafer 10 includes a device area 16, a scribed area 18, and a peripheral area 19 each including respective conductive regions 12 and isolation regions 14. The conductive region 12 in the scribed area 18 continues to the conductive region 12 in the peripheral area 19, but partly divided from the conductive region 12 in the device area 16 by the isolation region 14. A metal film 30 covers the peripheral area 19, a side, and a back surface of the wafer 10; that is, the conductive region 12 in the scribed area 18 is electrically connected to the back surface of the wafer 10 through the conductive region 12 in the peripheral area 19, the metal film 30 thereof, and the metal film 30 of the side of the wafer 10. Further, provided on the conductive region 12 and the isolation region 14 in the device area 16 is an insulating film 44 and a patterned photoresist 46, which exposes a top surface of the conductive region 12 in the device area 16 and the scribed area 18 within respective openings, 46a and 46b, in the device area 16 and the scribed area 18.

Figure 1C:
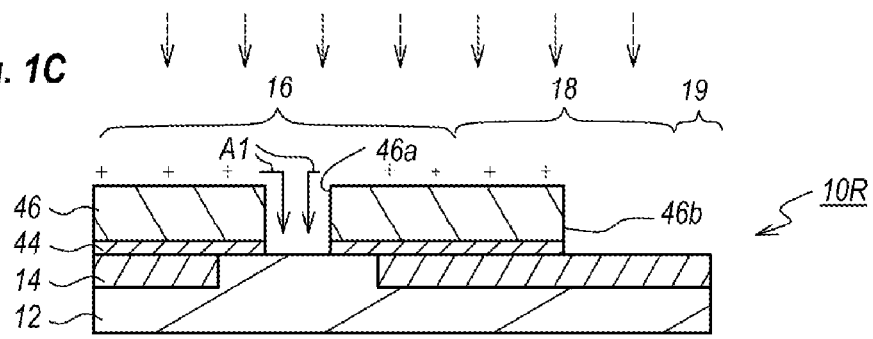

FIG. 1C also schematically shows a cross section of a semiconductor device 10R comparable to the present invention. The semiconductor device 10R has a feature distinguishable from those of the present invention is that the isolation region 14 in the scribed area 18 extends to the peripheral area 19 exceeding the device region 18. That is, even when the patterned photoresist 46 and the insulating film 44 exposes the surface of the wafer 10R in the scribed area 18 and the peripheral area 19, not the conductive region 12 but the isolation region 14 exposes.

The ICP etcher 20 shown in FIG. 1A generates ions or radicals of an etching gas which is, for instance, silicon tetrafluoride ($SF_6$) for etching an insulating film made of silicon nitride (SiN), and such ions or radicals are irradiated on the surface of the semiconductor wafer, 10 or 10R, accelerated by the electric field generated by the RF signal as FIGS. 1B and 1C indicate by arrows A1. The power of the RF signal in a bias thereof is 10 W in the embodiment. Thus, the insulating film 44 may be etched. Removing the insulating film 44, the surface of the semiconductor wafer, 10 or 10R, is exposed. The irradiation of ions or radicals on the surface of the photoresist 46 accumulates positive charges derived from the ions and/or the radicals contained in the plasma. This phenomenon is called as the charge-up.

The charge up during plasma the etching causes a voltage difference between the wafer 10R to be etched and the plasma. This voltage difference induces a current flowing into the wafer. The induced current tends to be concentrated in the device area 16 as denoted by arrows A1 in FIG. 1C which may cause damage in the conductive region 12 in the device area 16 and a device formed therein, which may be a field effect transistor (FET) and so on, degrades the reliability thereof. For instance, an FET experiencing plasma processes often shows an increased leak current. Also, the plasma process sometimes accompanies with arcing between the plasma and the wafer, which easily causes fatal damages in active devices such as FETs, and passive devices such as capacitors formed in the wafer, 10 or 10A. Because the substrate included in the wafer, 10 or 10R, is made of semi-insulating material, and the conductive region 12, especially, that made of nitride semiconductor materials such as GaN, also has extremely high resistivity, the charge induced by the plasma concentrates on the surface of the wafer, 10 or 10R, in particular, in a center of the surface of the wafer, 10 or 10R.

The wafer 10 of the embodiment shown in FIG. 1B provides no isolation region 14 in the scribed area 18, which means that the conductive region 12 in an exposed surface thereof is wider in the embodiment compared with the comparable example shown in FIG. 1C. Accordingly, the induced current A1 flows not only in the device area 16 but also in the scribed area 18. Moreover, the metal film 30 is in contact to the top, the side, and the back of the conductive region 12, which accelerates the current or the charge caused by the plasma to be easily dissipated to the back metal through the conductive region 12 in the scribed region and the peripheral region, and the metal film 30 in the top and the side of the wafer 10.

Thus, the arrangement of the wafer 10 including the conductive region 12, the isolation region 14, and the metal film 30 may suppress the induced current flowing in the conductive region 12 of the device area 16 and also the arcing caused in the conductive region 12. Thus, the conductive region 12 of the embodiment may be substantially released from damages during the plasma process. As FIG. 1B indicates, the conductive region 12 uniformly extends in the device area 16 and the scribed area 18. Moreover, the conductive region 12 in the scribed area 18 is substantially united to the conductive region 12 in the peripheral area 19. Thus, the charges induced in the device area, and that in a center of the wafer 10, may easily dissipate to the metal film 30 through the conductive region 12 in the scribed area 18 and that in the peripheral area 19. Also, such an arrangement of the wafer 10 may uniformly set an electrical potential substantially in a whole of the wafer 10, which may realize a uniform etching rate in the whole wafer.

Figure 2A:
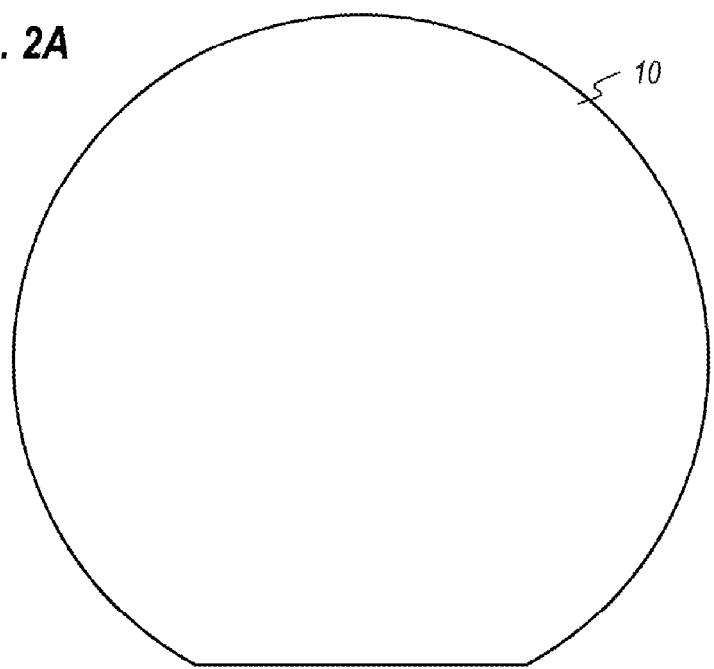
FIG. 2A is a plan view of the wafer.
Figure 2B:
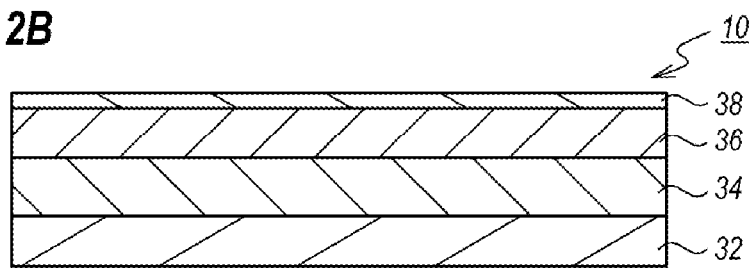
FIG. 2B shows a cross section of the wafer.

Next, an arrangement of the wafer 10 will be described. FIG. 2A is a plan view of the wafer 10, while, FIG. 2B shows a cross section of the wafer 10. The wafer 10 provides a substrate 32, a channel layer 34, a barrier layer 36, and a cap layer 38 from the bottom therein in this order. The wafer 10 may further provide a buffer layer between the substrate 32 and the channel layer 34.

The substrate 32 may be made of silicon carbide (SiC), silicon (Si), sapphire ($Al_2O_3$), and so on. The channel layer 34, the barrier layer 36, and the cap layer 38, which are sequentially grown on the substrate 32, may be made of intrinsic (i-type) gallium nitride (GaN), aluminum gallium nitride (AlGaN), and GaN, respectively.

Figure 3A:
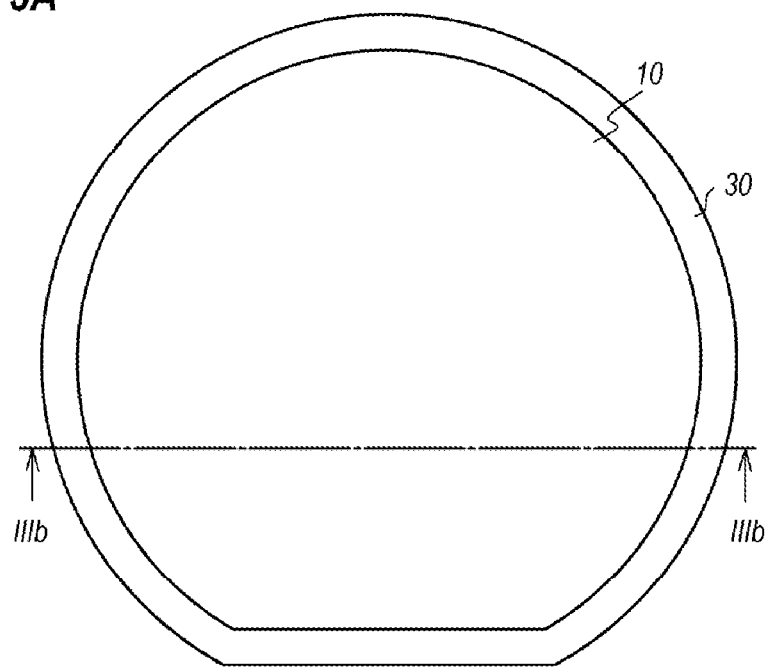
FIG. 3A is a plan view of the wafer.
Figure 3B:
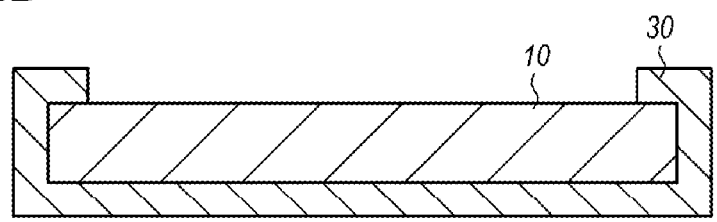
FIG. 3B shows cross section of the wafer taken along the line IIIb-IIIb indicated in FIG. 3A.

Next, a process of forming the semiconductor device 1 according to the first embodiment of the present invention will be described. FIG. 3A is a plan view of the wafer 10, while, FIG. 3B shows cross section taken along the line IIIb-IIIb indicated in FIG. 3A. The process first deposits the metal film 30 in the back surface and the side of the wafer 10. Depositing the metal or metals onto the back surface of the wafer 10 by the metal evaporation or the metal sputtering, a portion of the evaporated metal or the sputtered metal adheres to the side and the periphery of the top surface of the wafer 10 as shown in FIG. 3B. Thus, the metal film 30 may surround the wafer 10. The metal film 30 may be a stack of titanium (Ti) and tungsten (W), where Ti is in contact to the wafer 10, with a total thickness of about 200 nm.

Figure 4A:
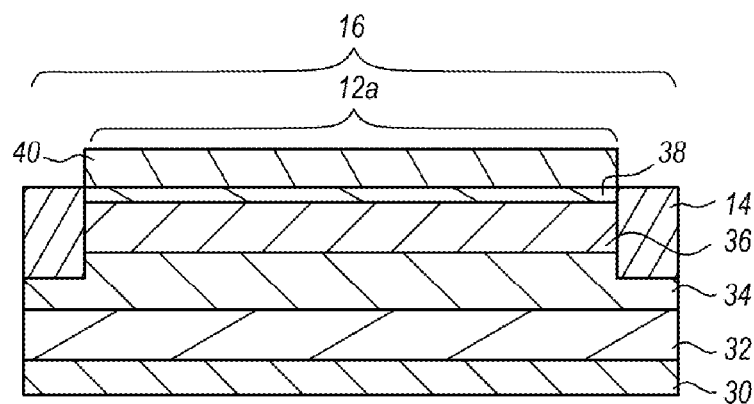
FIG. 4A illustrates the process of forming the electron device of the present invention by schematically showing a cross section of the device area, while, FIG. 4B also illustrates the process by schematically showing the cross section of the scribed area.
Figure 4B:
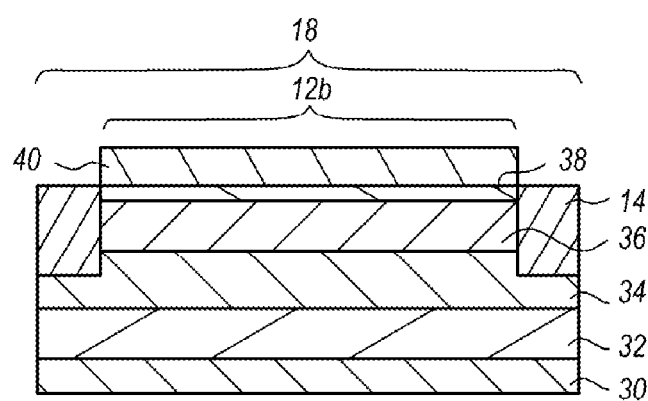

FIG. 4A illustrates the process of forming the electron device of the present invention by schematically showing a cross section of the device area 16, while, FIG. 4B also illustrates the process by schematically showing the cross section of the scribed area 18. The semiconductor stack in the device area 16 is symbolled by 12a, while, the semiconductor stack in the scribed area 18 is symbolled by 12b. The process prepares a patterned photoresist 40 on the wafer 10 that covers the conductive region 12a in the device area 16 and that 12b in the scribed area 18 but exposes outsides of the semiconductor stacks, 12a and 12b. Then, the process performs the ion implantation of argon ($Ar^+$) under conditions: the acceleration voltage of 30 to 120 keV and the dosage of $1\sim5\times10^{12}/cm^{-2}$. The ion implantation thus carried out may form the isolation regions 14 in the cap layer 38, the barrier layer 36, and a portion of the channel layer 34 as leaving the semiconductor stacks, 12a and 12b, in centers of the device area 16 and the scribed area 18. After the ion implantation, the process removes the patterned photoresist 40.

Figure 5A:
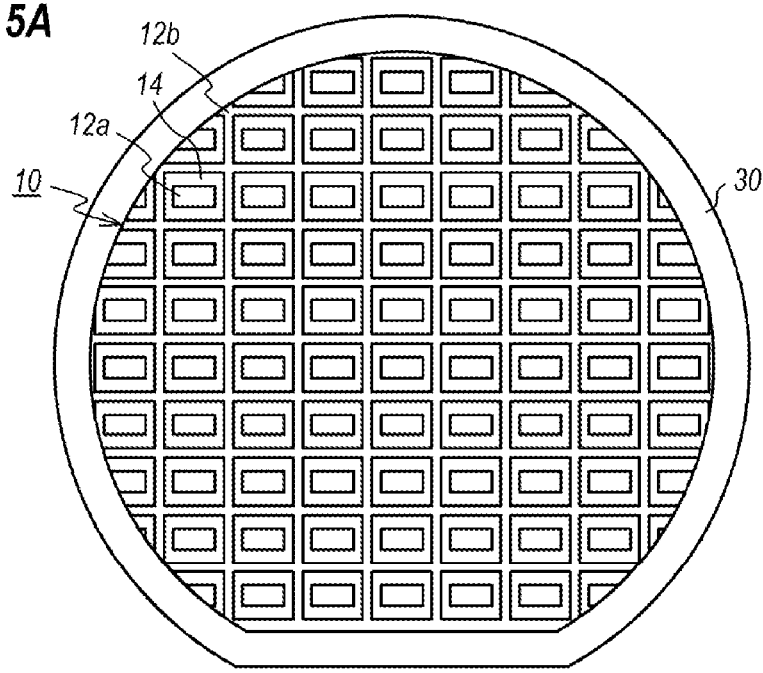
FIG. 5A is a plan view of the wafer, FIG. 5B magnifies peripheries of the wafer, and FIG. 5C schematically shows the cross section of the wafer taken along the line Vc-Vc indicated in FIG. 5B.
Figure 5B:
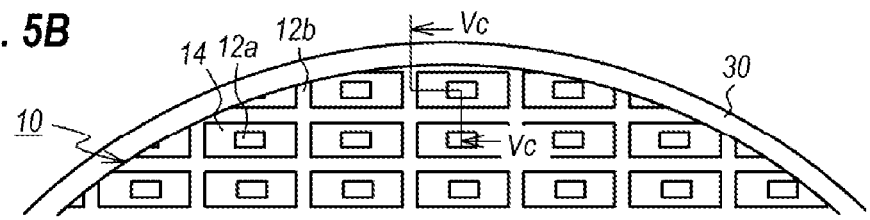
Figure 5C:
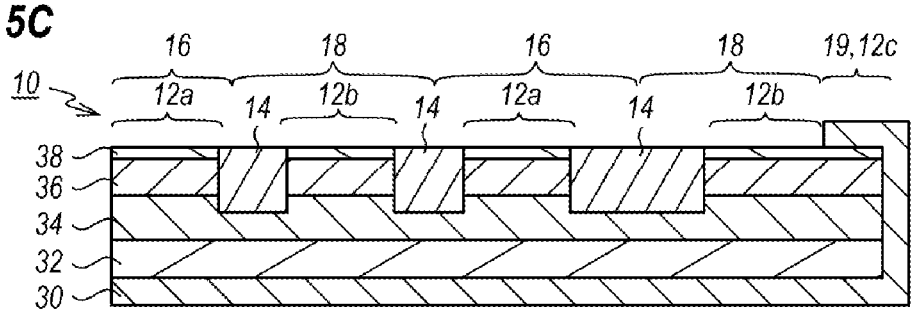
Figure 6:
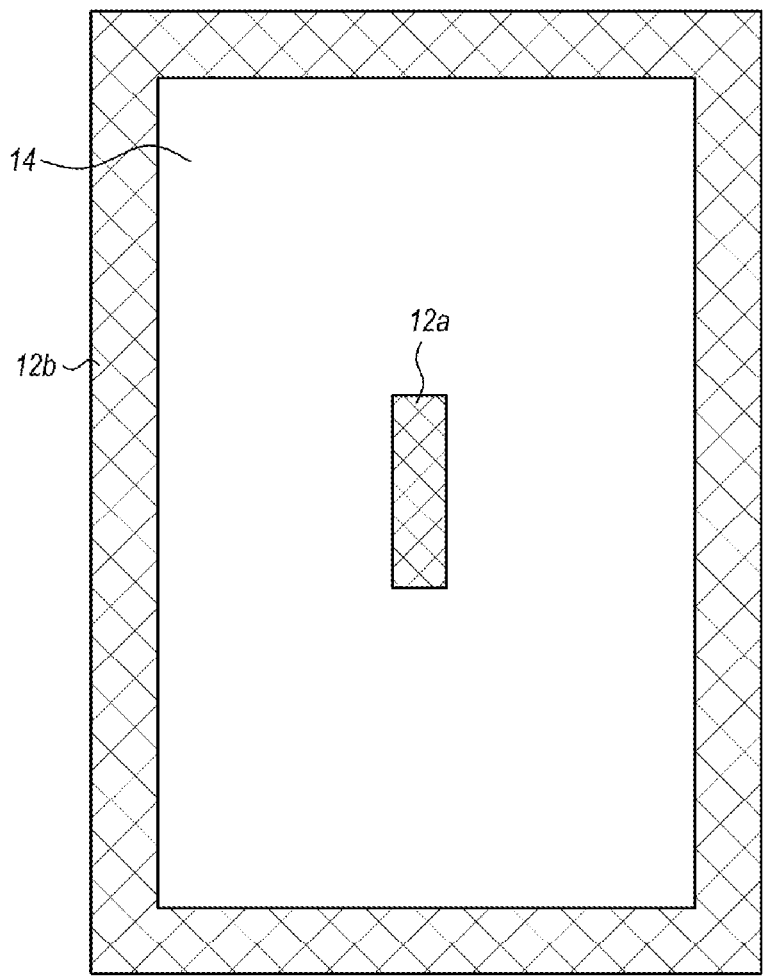
FIG. 6 is a plan view of a semiconductor chip that magnifies a portion in the wafer where one semiconductor chip is to be formed.

FIG. 5A is a plan view of the wafer, FIG. 5B magnifies peripheries of the wafer 10, and FIG. 5C schematically shows the cross section of the wafer 10 taken along the line Vc-Vc indicated in FIG. 5B. FIG. 6 is a plan view of a semiconductor chip that magnifies a portion in the wafer 10 where one semiconductor chip is to be formed. As FIG. 6 indicates, the isolation region 14 surrounds the conductive region 12a in the device area 16, while, the conductive region 12b in the scribed area 18 surrounds the isolation region 14. The semiconductor stacks 12a in the device regions 14 are divided by the isolation regions and the semiconductor stacks 12b in the scribed area 18. Also, as FIG. 5C illustrates; the peripheral area 19 has no isolation regions 14 because the metal film 30 that covers the peripheral region is formed thereon in advance to the ion implantation. Accordingly, the peripheral area 19 leaves another conductive region 12c therein that electrically in contact to the metal film 30. The conductive region 12b in the scribed area 18 extends as tracing the scribed area 18 and continues to the conductive region 12c in the peripheral area 19, which means that the conductive region 12b electrically continues to the conductive region 12c.

Figure 7A:
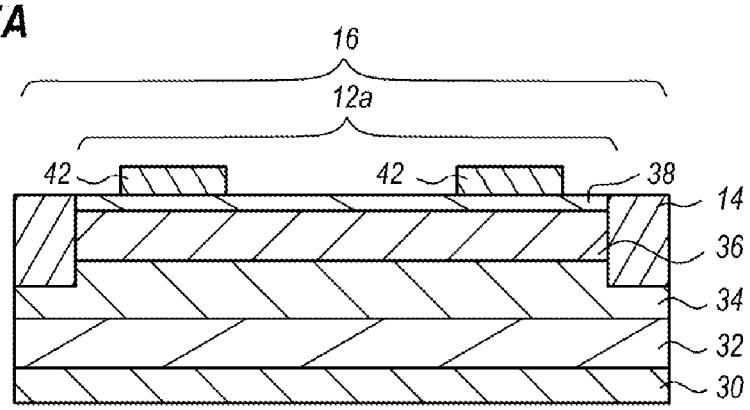
FIG. 7A shows the process by schematically illustrating a cross section of the device area, while, FIG. 7B also shows the process by schematically illustrating a cross section of the scribed area.
Figure 7B:
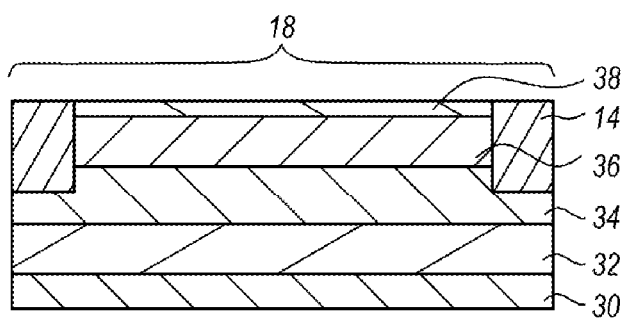

FIG. 7A shows the process by schematically illustrating a cross section of the device area 16, while, FIG. 7B also shows the process by schematically illustrating a cross section of the scribed area 18. Sequential process of the metal evaporation and the lift-off technique may form two electrodes 42 on the cap layer 38 in the device area 16. Subsequent teat treatment of the electrodes 42 at, for instance, 600° C., makes the electrodes in ohmic contact to the conductive region 12a. One of the electrodes 42 is for the source electrode, while, the other is for the drain electrode. The electrodes 42 includes, from the side of the cap layer 38, a stack of tantalum (Ta), aluminum (Al) and another tantalum (Ta), namely Ta/Al/Ta, with a total thickness of 300 to 500 nm. As FIG. 7B indicates, the process does not form any electrodes in the scribed area 18.

Figure 8A:
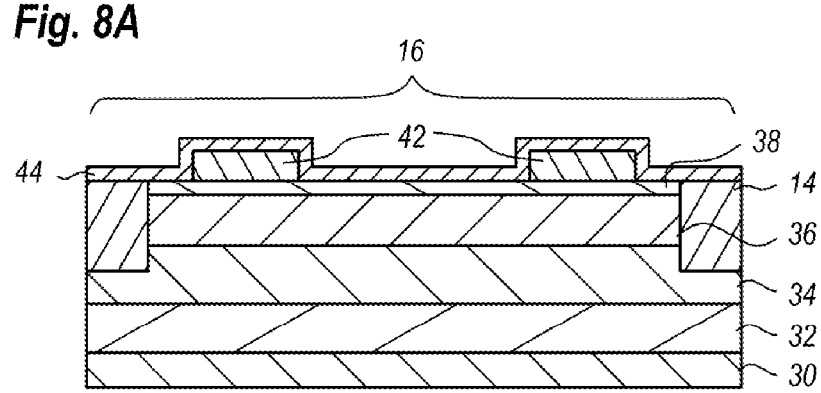
FIG. 8A and 8B show cross sections of the device area and the scribed area, respectively, at a process carried out subsequent to the process shown in FIGS. 7A and 8B.
Figure 8B:
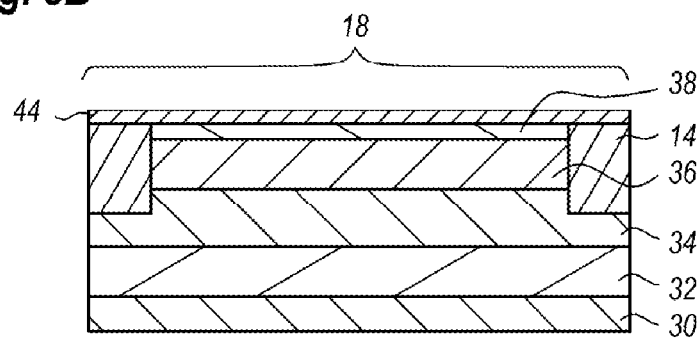

FIG. 8A and 8B show cross sections of the device area 16 and the scribed area 18, respectively, corresponding to a process carried out subsequent to the process shown in FIGS. 7A and 8B. The plasma-enhanced chemical vapor deposition (p-CVD) technique or the atomic layer deposition (ALD) technique may form an insulating film 44 with a thickness of 50 to 100 nm so as to cover the wafer 10. The insulating film 44 is preferably made of silicon nitride (SiN) or other electrically insulating materials.

Figure 9A:
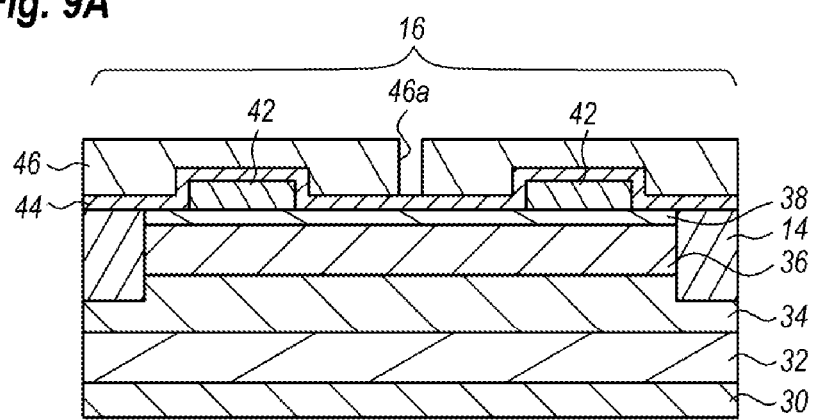
FIGS. 9A and 9B show the process, which is subsequent to the process illustrated in FIGS. 8A and 8B, by a cross section of the device area and that of the scribed area, respectively.
Figure 9B:
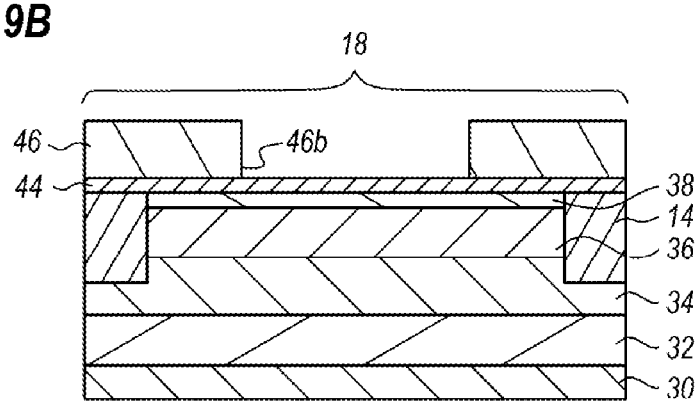

FIGS. 9A and 9B show the process, which is subsequent to the process illustrated in FIGS. 8A and 8B, by a cross section of the device area 16 and that of the scribed area 18, respectively. The process prepares another patterned photoresist 46 on the insulating film 44, where the patterned photoresist 46 provides openings, 46a and 46b, in the device area 16 and the scribed area 18, respectively. The surface of the cap layer 38 is exposed in the bottoms of the openings, 46a and 46b.

Figure 10A:
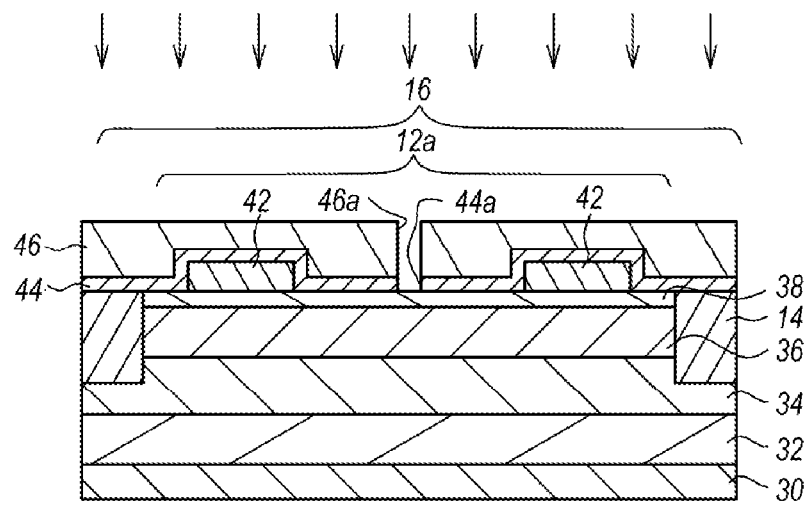
FIG. 10A illustrates the process by showing a cross section of the device area, which is taken along the line Xa-Xa indicated in FIG. 11, and FIG. 10B also illustrates the process by showing another cross section of the scribed area.
Figure 11:
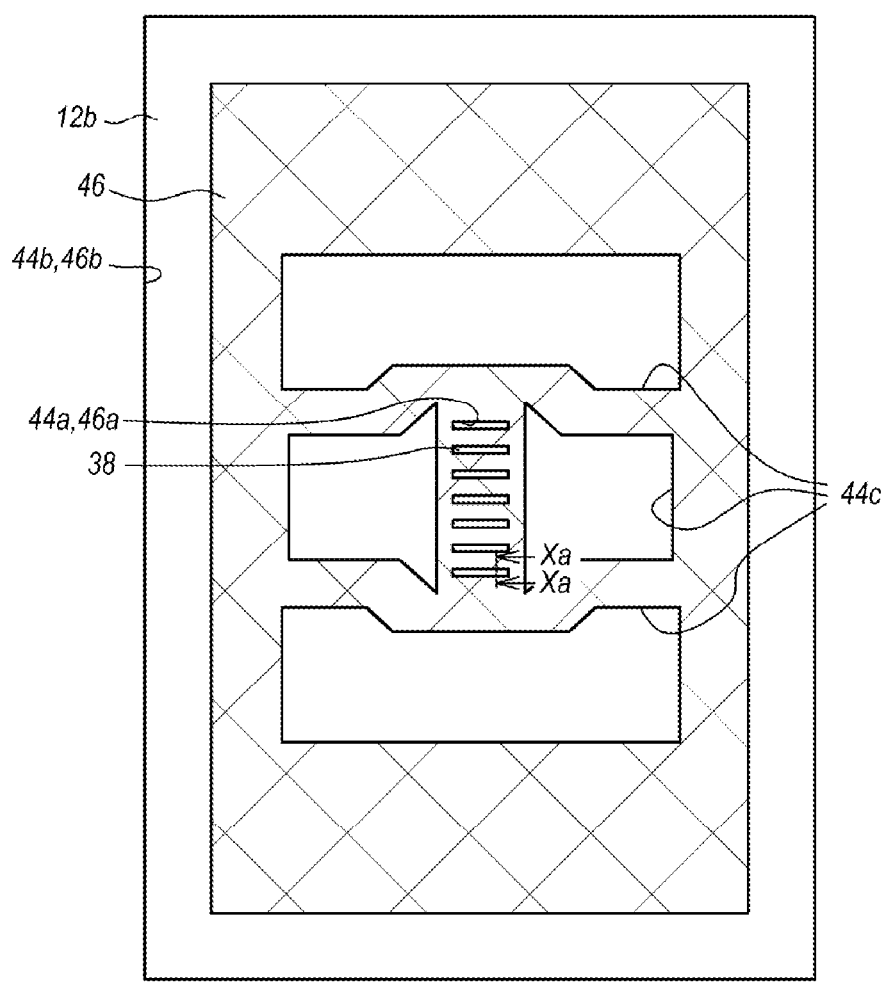
FIG. 11 magnifies a portion of the wafer 10 where one semiconductor chip is to be formed therein.

FIG. 10A illustrates the process by showing a cross section of the device area 16, which is taken along the line Xa-Xa indicated in FIG. 11, and by showing another cross section of the scribed area 18. FIG. 11 magnifies a portion of the wafer 10 where one semiconductor chip is to be formed therein. The plasma removes the insulating film 44 exposed within the openings, 46a and 46b, in the patterned photoresist 46 so as to form an opening 44a in the insulating film 44. This opening 44a is provided for the gate electrode and exposes a portion of the conductive region 12a therein. Also, the plasma etching forms another opening 44b in the insulating film 44, which exposes the conductive region 12b in the scribed area 18 therein. Still other openings 44c may be formed corresponding to pads for the drain, the source, and the gate electrodes. Although the process of the present embodiment provides the openings 44c for the pads, these openings 44c are optionally formed, namely, not always necessary. The plasma etching may be carried out by the apparatus 20 shown in FIG. 1A under conditions of: the reactive gas of $SF_6$, the gas pressure of 0.1 to 5 Pa, and the bias power of 10 W. During the plasma process, the metal film 30 is connected to the apparatus ground. After the completion of the plasma process, the patterned photoresist may be removed from the wafer 10.

the plasma etching electrifies the surface of the wafer 10. As described in FIG. 1B, charges accumulates in the semiconductor stacks, 12a and 12b, in the device area 16 and the scribed area 18. The latter conductive region 12b in the scribed area 18 extends and continues to the conductive region 12c in the peripheral area 19. Because the metal film 30 is electrically connected to the conductive region 12c in the peripheral area 19, extends to the back surface of the wafer 10, and grounded to the etching apparatus thereat. The charges accumulated in the semiconductor stacks, 12a and 12b, discharges to the back surface of the wafer 10 through the metal film 30 and the semiconductor stacks, 12a to 12c. Thus, the charges accumulated in the surface of the wafer 10 during the plasma process may be discharged without causing damages in the conductive region 12a; in particular, the channel layer 34 in the conductive region 12a and the lead current between the electrodes may be suppressed.

When the wafer 10 is made of electrically insulating material, for example silicon carbide (SiC), sapphire ($Al_2O_3$), and so on, the wafer 10 in the surface there of may easily charge-up. As the first embodiment discloses above, even the wafer 10 is made of electrically insulating material, the arrangement of the semiconductor device 10 may effectively suppress the charge-up, and makes the electron device 10 free from the degradation.

Figure 12A:
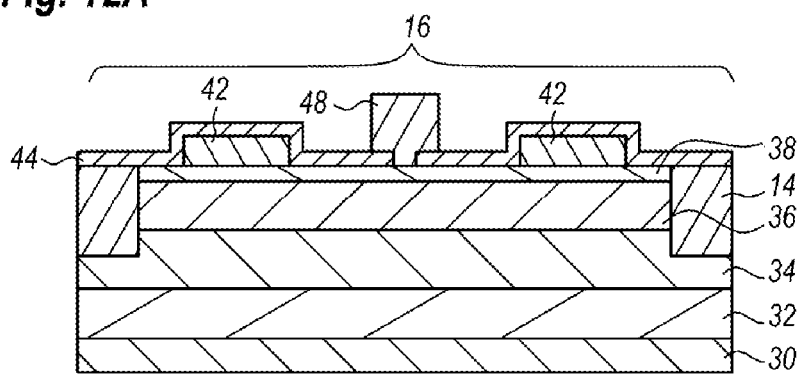
FIG. 12A illustrates the process by showing a cross section of the device area, while, FIG. 12B also illustrates the process by showing another cross section of the scribed area.
Figure 12B:
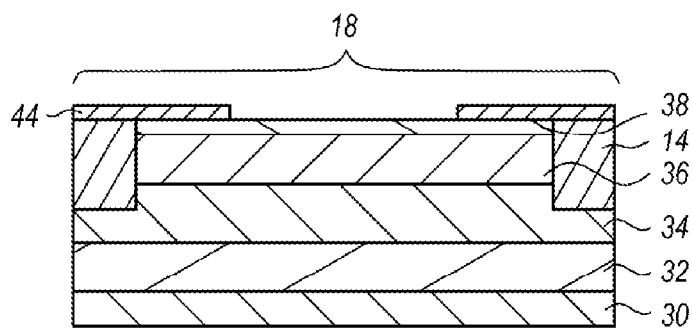

FIG. 12A illustrates the process by showing a cross section of the device area 16, while, FIG. 12B also illustrates the process by showing another cross section of the scribed area 18. The metal evaporation accompanied with the lift-off technique subsequently carried out may form the gate electrode 48 on the cap layer 38 exposed in the bottom of the opening, The gate electrode 48 may stack metals of nickel (Ni), palladium (Pd), and gold (Au), namely Ni/Pd/Au, where nickel (Ni) is in contact to the cap layer 38. The gate electrode 48 may have a total thickness of 300 to 600 nm. As FIGS. 12A and 12B indicates, the scribed area 18 provides no metals for the gate electrode.

Figure 13A:
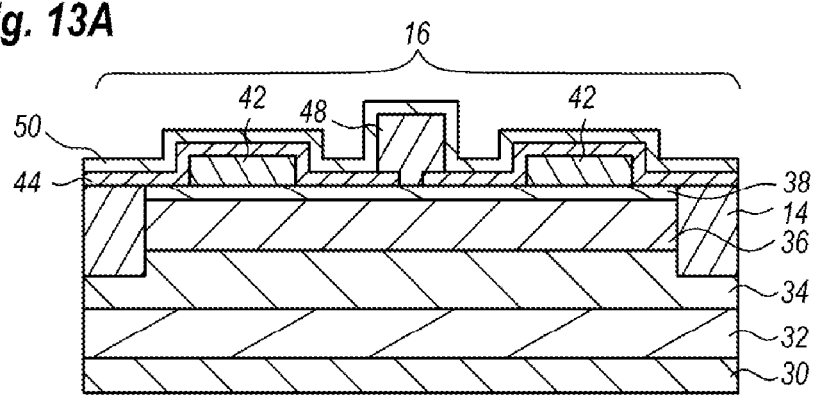
Figure 13B:
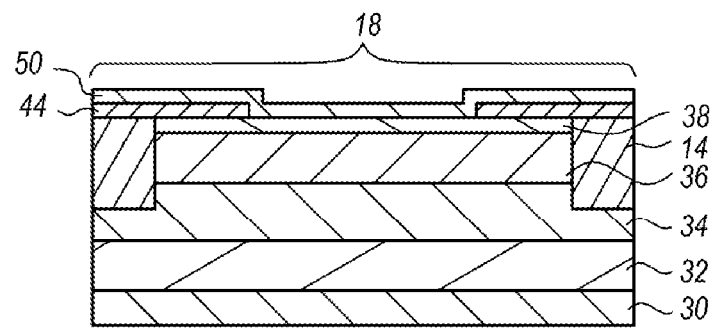
FIG. 13B shows another cross section in the scribed area.

FIG. 13A illustrates the process by showing a cross section in the device area 16, while, FIG. 13B shows another cross section in the scribed area 18. The process forms the second insulating film 50 by the p-CVD technique or the ALD technique with a thickness of 50 to 400 nm so as to cover the first insulating film 44 and the gate electrode 48. The second insulating film 50 also coverts the cap layer 38 exposed in the scribed area 18. The second insulating film 50 may be made of silicon nitride (SiN).

Figure 14A:
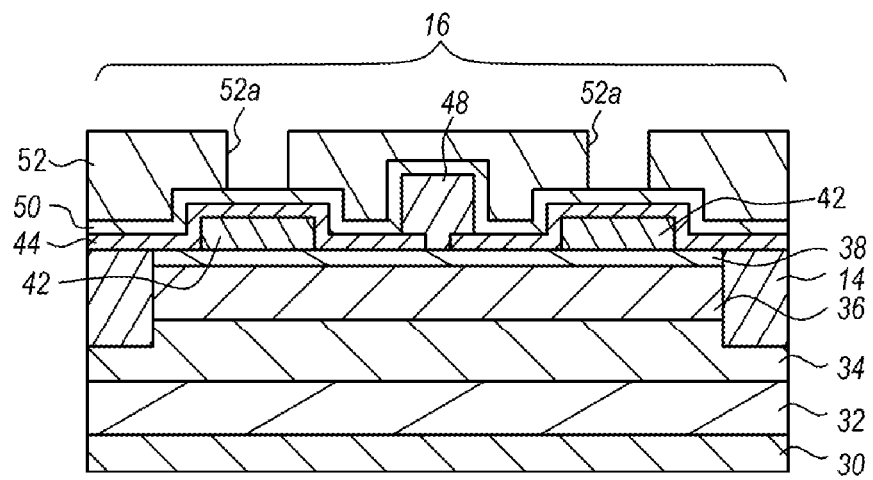
FIG. 14A illustrates the process by showing a cross section of the device area, while FIG. 14B also shows the process by showing another cross section in the scribed area, where the process shown in FIGS. 14A and 14B may be carried out subsequent to the process shown in FIGS. 13A and 13B.
Figure 14B:
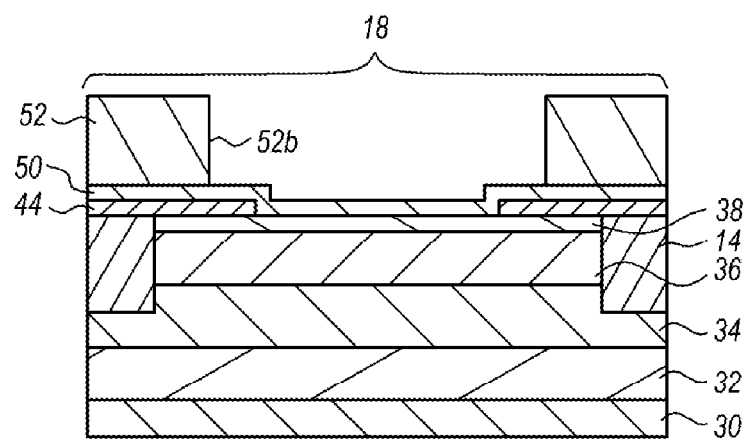

FIG. 14A illustrates the process by showing a cross section of the device area 16, while FIG. 14B also shows the process by showing another cross section in the scribed area 18, where the process shown in FIGS. 14A and 14B may be carried out subsequent to the process shown in FIGS. 13A and 13B. The process prepares still another patterned photoresist 52 on the second insulating film 50. The patterned photoresist 52 provides openings, 52a and 52b, each corresponding to the ohmic electrodes 42 for the source and the drain electrodes, respectively. These openings, 52a and 52b, expose surface of the second insulating film 50.

Figure 15A:
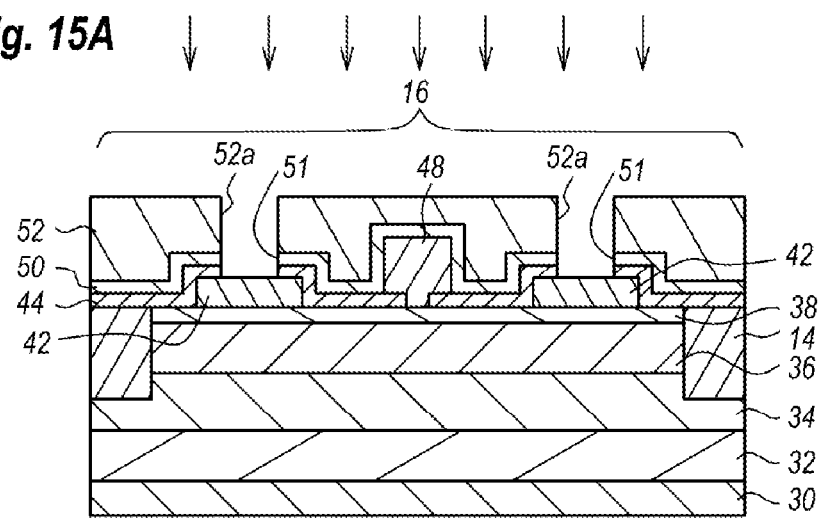
FIGS. 15A and 15B illustrate the process by showing cross sections in the device area, and the scribed area, respectively.
Figure 15B:
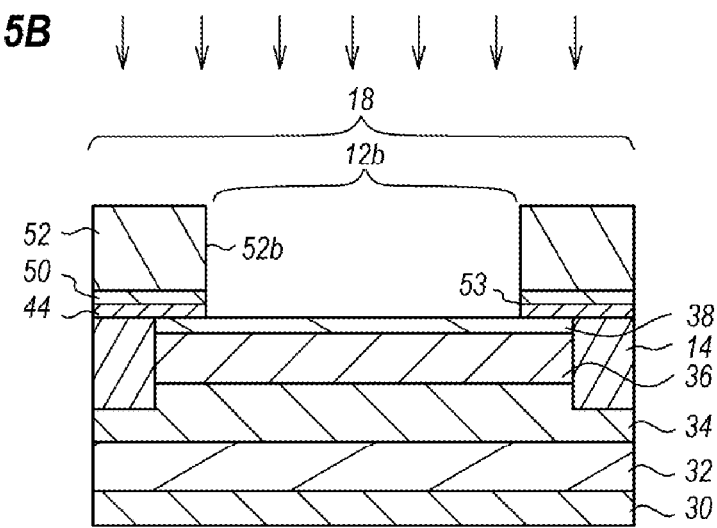
Figure 16:
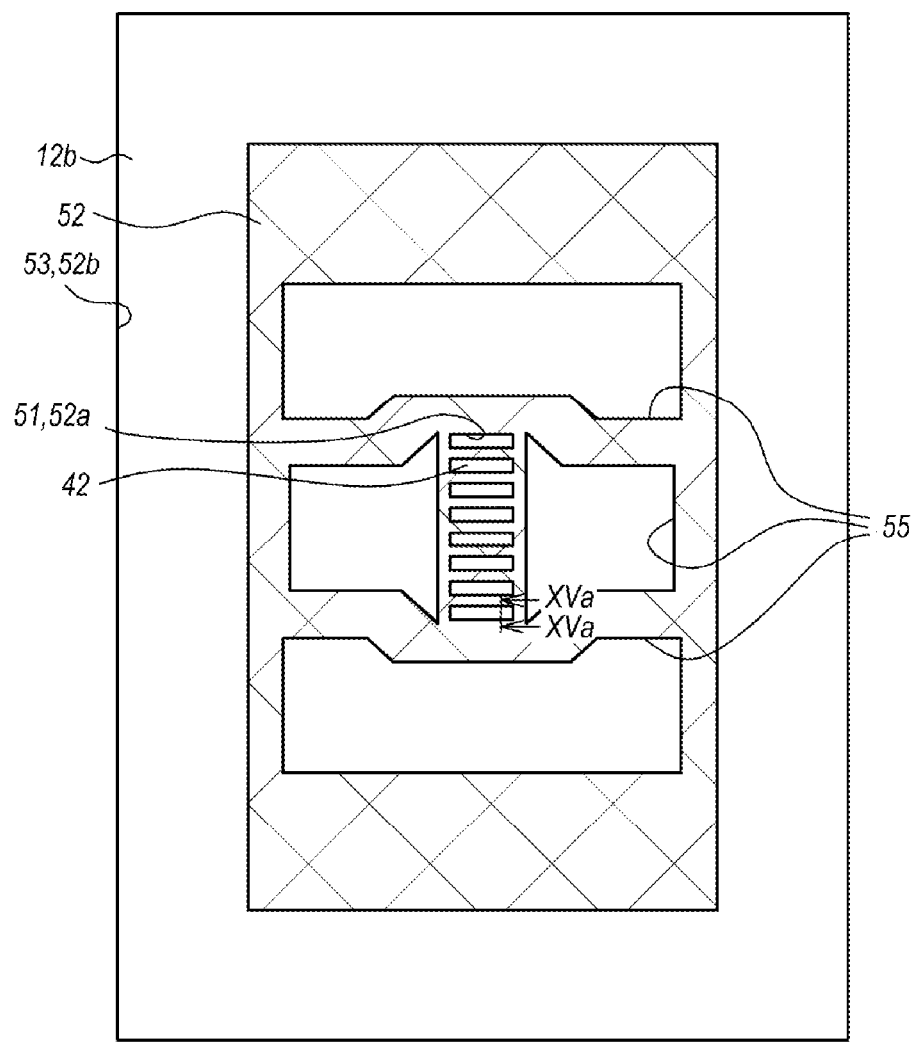
FIG. 16 magnifies a portion of the wafer where one semiconductor chip is to be formed therein.

FIGS. 15A and 15B illustrate the process by showing cross sections in the device area 16, and the scribed area 18, respectively. FIG. 16 magnifies a portion of the wafer 10 where one semiconductor chip is to be formed therein. The plasma process, exactly, the plasma etching partially removes the second and first insulating films, 50 and 44, exposed within the opening 52a of the photoresist 52 so as to form an opening 51 in the first and second insulating films, 44 and 50, that exposes the source and drain electrodes 42 in the device region, and those insulating films, 50 and 44, exposed within the opening 52b of the photoresist 52 so as to form another opening 53 also in the first and second insulating films, 44 and 50, which exposes the surface of the conductive region 12b in the scribed area 18. The plasma etching may still other openings 55 corresponding to the gate, the source, and the drain pads. The apparatus 20 explained in FIG. 1A may carry out the plasma etching of the present process by conditions of: the etching gas of $SF_6$, the gas pressure of 0.1 to 5 Pa, and the bias power of 10 W.

Although the plasma etching may electrify the surface of the wafer 10, the arrangement of the semiconductor stacks, 12a to 12c, and the metal film 30 may dissipate charges to be accumulated in the surface of the wafer 10 to the apparatus ground through the semiconductor stacks, 12a to 12c, and the metal film 30.

Figure 17A:
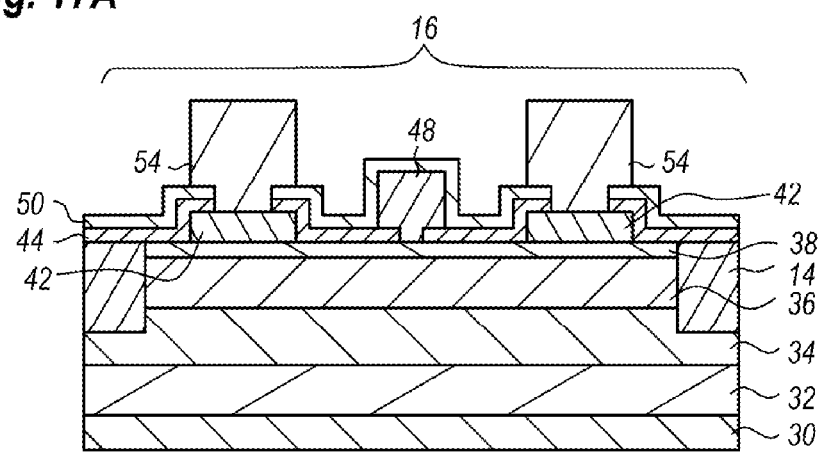
FIG. 17A illustrates the process by showing a cross section of the device area, while, FIG. 17B also illustrates the process by showing another cross section of the scribed area.
Figure 17B:
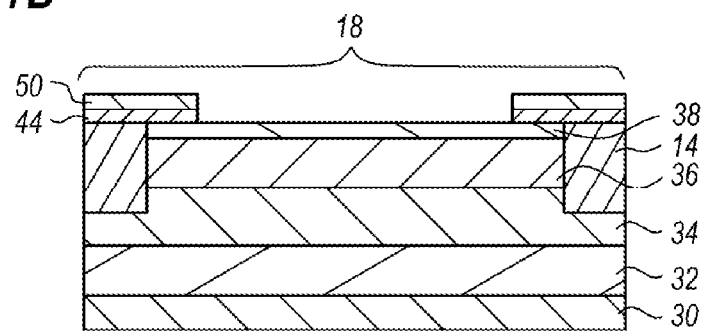

FIG. 17A illustrates the process by showing a cross section of the device area 16, while, FIG. 17B also illustrates the process by showing another cross section of the scribed area 18. The process may deposit interconnections on the source and drain electrodes 42. Specifically, after removing the patterned photoresist 52 shown in FIG. 15, the process may deposit a seed metal on a whole surface of the wafer 10, that is, the surface of the second insulating film 50, the ohmic electrodes, 42 exposed in the openings 51, and the surface of the cap layer 38 exposed in the other opening 53 of the first and second insulating films 44 and 50. Then still another patterned photoresist is prepared so as to expose the openings 51 and the second insulating film 50 in areas surrounding the openings 51 in the device area 16 but fully cover the surface of the cap layer 38 exposed in the opening 53 in the scribed area 18. Performing the selective plating by supplying currents to the seed metal, metal for the interconnection 54 may be deposited only on the seed metal exposed by the patterned photoresist. Sequentially removing the patterned photoresist and the seed metal exposed outside of the interconnections 54, the interconnections 54 may be obtained with a cross section shown in FIG. 17A. The scribed area 18 leaves no metals as illustrated in FIG. 17B.

FIG. 18A shows a cross section of the wafer 10, while, FIG. 18B illustrates the process of dividing the wafer 10 into respective semiconductor chips 60. The wafer 10, as FIG. 18A illustrates, provides the scribed area 18 between the device regions 16, and the process may divide the wafer 10 along the scribed area 18 into the respective chips 60 by a blade. The scribed area 18 in a center thereof provides the conductive region 12b. Specifically, the scribed area 18 has a width W1 greater than a width W2 of the conductive region 12b, where the former may be, for instance 100 μm, while, the latter may be, for instance 80 μm. Accordingly, a dicing or else may be divide the wafer 10 into the respective chips 60. The semiconductor chip 60 thus divided provides the isolation region 14 in peripheries thereof. Accordingly, even when bonding wires come in contact to the peripheries of the semiconductor chip 60, this contact does not mean the electrical connection between the bonding wires and the semiconductor chip 60.

Next, the semiconductor chip 60 of the present invention will be compared with a semiconductor chip formed by a conventional process be respective leak currents as an index. The isolation region 14 extends to the scribed area 18 in the conventional semiconductor chip and the wafer 10R provides no metal film 30. Other processes for the conventional semiconductor chip are substantially same with those of the present embodiment. The comparison between two chips was carried out by measuring the current leaked from the gate electrode to the drain electrode under a reverse bias condition. Two chips commonly had the substrate 32, the channel layer 34, the barrier layer 36, and the cap layer 38 each made of SiC, GaN, AlGaN, and GaN, respectively.

Figure 19:
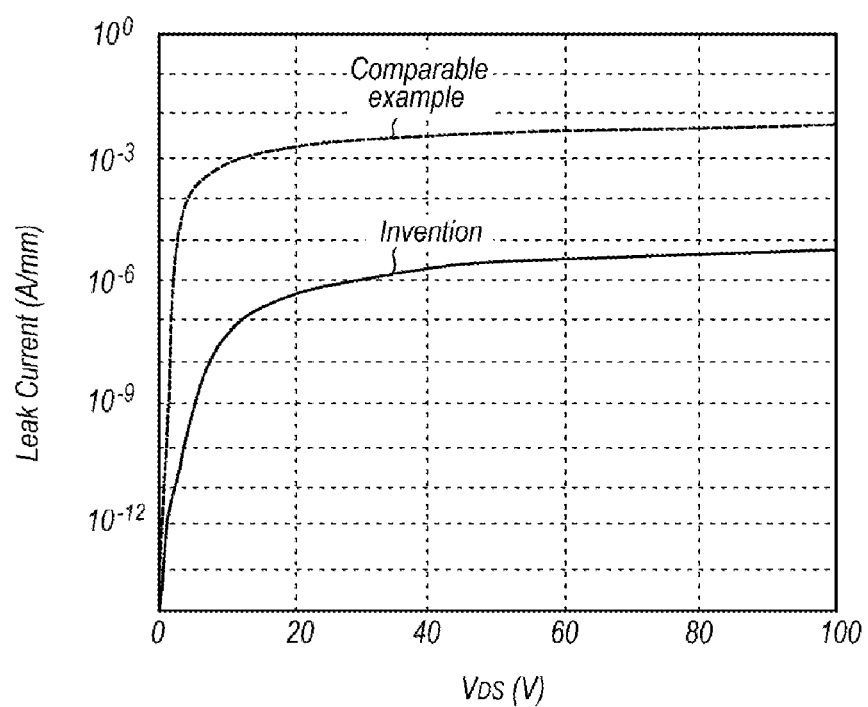
FIG. 19 compares the leak currents of two FETs Next, embodiment of the present invention will be described as referring to drawings. In the explanation of the drawings, numerals or symbols same with or similar to each other will refer to elements same with or similar to each other without duplicating explanations.

FIG. 19 compares the leak currents of two FETs, where the horizontal axis corresponds to the drain bias, and the vertical axis shows the gate leak current. The gate leak currents monotonically increase in two FETs as the drain bias increases. However, the magnitude thereof shows a considerable difference, that is; the gate leak current of the semiconductor FET of the invention is about $\frac{1}{1000}$ of that of the conventional semiconductor FET. In the conventional semiconductor FET, charges induced during the plasma etching of the second and first insulating films, 50 and 44, primarily concentrates on the conductive region 12a in the device region, or, induced charges are hard to be conducted to the ground of the apparatus of the plasma etching; accordingly, the conductive region 12a around a portion in the device area 16, to which the gate electrode 48 is formed, is possibly damaged, which may be a primary reason why the conventional semiconductor FET shows the considerable gate leak current.

On the other hand, the FET of the present embodiment leaves the conductive regions, 12b and 12c, in the scribed area 18 and the peripheral area 19, respectively. Moreover, the conductive region 12c in the peripheral area 19 is directly in contact to the metal film 30 that extends to the back surface of the wafer 10 and is connected to the apparatus ground thereat. Accordingly, the charges induced by the plasma may easily dissipate to the apparatus ground, which may effectively prevent the damage possibly caused in the conductive region 12a, in particular a portion beneath the gate electrode 48, in the device area 16. Thus, the FET 60 formed by the process of the present invention may show the gate leak current far smaller than that shown by the conventional FET. Also, the arrangement of the conductive areas, 12a to 12c, may prevent the breakage of the semiconductor layers, 32 to 38, by arcing.

the conductive region 12b is left along the scribed area 18. The scribed area 18 has a width W1 preferably wider than a width W2 of the conductive region 12b. Also, the scribed area 18 preferably leaves the conductive region 12b along a center thereof and the isolation regions 14 along respective sides thereof. This arrangement of the scribed area 18 may effectively prevent a bonding wire, which is electrically coupled to the FET formed in a center of the device area 16, from making a short circuit to the conductive region 12 after the division of the respective FETs by dicing along the scribed area 18, because, the conductive region 12b in the scribed area 18 is substantially removed during the dicing. When the scribed area 18 in a whole surface thereof exposes the conductive region 12b, that is, no isolation regions are left along the edges of the scribed area 18; such a conductive region 12b is preferably removed entirely during the dicing.

the metal film 30 may be deposited by the metal evaporation, or the metal sputtering, onto the back surface of the wafer 10. Such metal evaporation, or the metal sputtering, concurrently deposits the metal onto the side and the peripheries of the top surface of the wafer 10. Because the metal film 30 adhering onto the back surface of the wafer 10 is ground to the apparatus 20 during the plasma process, the charges induced during the plasma process easily dissipates to the apparatus ground. The metal film 30 preferably covers a whole side of the wafer 10, which enhances the charges possibly accumulated on the surface of the wafer 10 to dissipate toward the sides of the wafer 10 uniformly. Although the embodiment above described forms the conductive regions, 12b and 12c, in the scribed area 18 and the peripheral area 19 by leaving the semiconductor layers, 32 to 38, as they are epitaxially grown; namely, without implanting the ions for forming the isolation regions 14. However, the process may perform the implantation for the scribed area 18 and the peripheral area 19 but with ions operable as donors after the heat treatment. Such an ion implantation may further reduce the resistivity of the scribed area 18 and the peripheral area 19, and accelerates the charges to dissipate to the apparatus ground through those conductive regions, 12b and 12c, and the metal film 30.

Figure 10B:
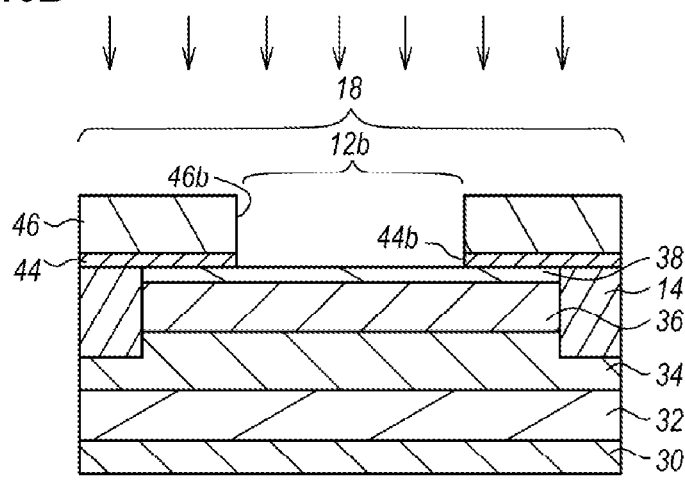

The plasma process shown in FIGS. 10A and 10B, that forms an opening 44a for the gate electrode 48; and another plasma process shown in FIGS. 15A and 15B, that forms the opening 51 for the source and drain electrodes, exposes the conductive region 12b in the scribed area 18. Thus, the charges induced by the plasma may be effectively dissipated to the apparatus ground in respective processes. Even when the process performs three or more plasma processes, the charged induced during the process may be effectively dissipated to the metal film 30 by exposing the conductive region 12b in the scribed area 18. The embodiment concentrates on the plasma etching, other processes using plasma such as plasma ashing and/or plasma enhanced chemical vapor deposition (p-CVD) preferable exposes the conductive region 12b in the scribed area 18 to dissipate the charges induced by the plasma effectively to the metal film 30.

Also, the embodiment concentrates on the process of forming an FET 60. However, the invention is applicable to other type of devices or to a device integrating two or more FETs. The number of the semiconductor chips yielded within a wafer 10 is optional. As the conductive region 12b increases sizes or numbers thereof, the charges induced during the plasma process easily dissipate to the metal film 30; accordingly, the scribed region 18 is preferably secured as wide as possible taking the yield of the semiconductor chips within the wafer 10.

The wafer 10 may include a compound semiconductor material, typically nitride semiconductor materials and arsenic semiconductor materials, where the former includes gallium nitride (GaN), aluminum gallium nitride (AlGaN), indium gallium nitride (InGaN), indium nitride (InN), aluminum indium gallium nitride (AlInGaN), and so on; while, the former includes gallium arsenide (GaAs). The semiconductor chip 60 is not restricted to the FET. The semiconductor chip 60 may include other types of electron devices, such as hetero-bipolar transistor (HBT), and so on. Also, the insulating films, 44 and 50, may include silicon oxide ($SiO_2$), silicon oxy-nitride (SiON), aluminum nitride (AlN), and so on.

while particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The present application claims the benefit of priority of Japanese Patent Application No. 2015-224110, filed on Nov. 16 2015, which is incorporated herein by reference.

I claim:

1. A method of forming a semiconductor device on a wafer using a plasma process, the semiconductor device providing device areas each having a conductive region, scribed areas each having a conductive region, and a peripheral area having a conductive region, the peripheral area being provided in a periphery of the wafer, the process comprising steps of:

implanting ions between the device areas and the scribed areas to form isolation regions that electrically isolates the conductive region in the device areas from the conductive region in the scribed areas, the isolation regions surrounding the conductive regions in the device areas, the conductive regions in the scribed areas surrounding the isolation regions;

forming a metal film on a back surface, a side, and the peripheral area of the wafer in a top surface thereof opposite to the back surface, the conductive region in the peripheral area being continuous to the conductive regions in the scribed areas;

Forming an insulating film on a whole of the top surface of the wafer; and

Selectively etching the insulating film by a plasma process to expose the conductive regions in the device areas and the conductive regions in the scribed areas.

2. The method of claim 1,
further including a step of forming gate metals so as to be in directly contact to the conductive regions in the device areas exposed by the plasma process, the conductive regions in the scribed areas and the conductive region in the peripheral area being not covered with the gate metals.

3. The method of claim 1,
wherein the step of selectively etching the insulating film includes a step of electrically connecting the metal film to an apparatus ground, the plasma process being carried out within the apparatus.

4. The method of claim 1,
further including a step of growing semiconductor layers on a semiconductor substrate before the step of implanting the ions, the semiconductor substrate and the semiconductor layers comprising the wafer, the semiconductor layers forming the conductive regions in the device areas, the conductive regions in the scribed areas, and the conductive regions in the peripheral area.

5. The method of claim 4,
wherein the isolation regions formed by the step of the implanting the ions has a depth shallower than a thickness of the semiconductor layers.

6. The method of claim 4,
wherein the step of forming the semiconductor layers includes a step of sequentially growing a channel layer and a barrier layer on the substrate, the channel layer and the barrier layer being made of nitride semiconductor material on the substrate.

7. The method of claim 6,
further including a step of epitaxally growing a cap layer made of nitride semiconductor material on the barrier layer.

8. The method of claim 1,
wherein the insulating film is made of silicon nitride (SiN), and
wherein the step of selectively etching the insulating film is carried out by using hexafluoride ($SF_6$) as an etching gas.

9. The method of claim 1
further including a step of dividing the wafer along the scribed areas.

10. The method of claim 1,
wherein the step of selectively etching the insulating film is performed by an inductively coupled plasma etching.

11. The method of claim 1,
further including steps of implanting another ions into the scribed areas and the peripheral area, and activating the another ions by a heat treatment of the wafer, the another ions showing a function of donors.

* * * * *